US008054355B2

(12) United States Patent
McCarten et al.

(10) Patent No.: US 8,054,355 B2
(45) Date of Patent: Nov. 8, 2011

(54) IMAGE SENSOR HAVING MULTIPLE SENSING LAYERS

(75) Inventors: John P. McCarten, Penfield, NY (US); Joseph R. Summa, Hilton, NY (US); Cristian A. Tivarus, Pittsford, NY (US)

(73) Assignee: Omnivision Technologies, Inc., Santa Clara, CA (US)

( * ) Notice: Subject to any disclaimer, the term of this patent is extended or adjusted under 35 U.S.C. 154(b) by 555 days.

(21) Appl. No.: 12/252,399

(22) Filed: Oct. 16, 2008

(65) Prior Publication Data

US 2010/0097514 A1 Apr. 22, 2010

(51) Int. Cl.
*H04N 3/14* (2006.01)
*H04N 9/04* (2006.01)
*H04N 5/225* (2006.01)

(52) U.S. Cl. ......................... 348/294; 348/282; 348/340

(58) Field of Classification Search .......... 348/241–252, 348/294, 296, 282, 340
See application file for complete search history.

(56) References Cited

U.S. PATENT DOCUMENTS

| | | | | |
|---|---|---|---|---|
| 4,238,760 | A | 12/1980 | Carr | 257/443 |
| 5,189,500 | A | 2/1993 | Kusunoki | 349/17 |
| 6,226,034 | B1 * | 5/2001 | Katayama | 348/242 |
| 7,214,999 | B2 | 5/2007 | Holm et al. | 257/444 |
| 7,339,216 | B1 * | 3/2008 | Lyon et al. | 257/291 |
| 2003/0209652 | A1 | 11/2003 | Fujii et al. | |
| 2004/0178478 | A1 | 9/2004 | Shizukuishi | 257/620 |
| 2005/0139828 | A1 | 6/2005 | Maruyama et al. | |
| 2005/0264662 | A1 | 12/2005 | Suzuki et al. | 348/294 |
| 2007/0024931 | A1 | 2/2007 | Compton et al. | |
| 2007/0279661 | A1 | 12/2007 | Misawa | |
| 2008/0083939 | A1 | 4/2008 | Guidash | |

FOREIGN PATENT DOCUMENTS

| | | | |
|---|---|---|---|
| WO | WO 02/27804 | A2 | 4/2002 |
| WO | WO-0227804 | | 4/2002 |
| WO | WO 2005/119791 | A1 | 12/2005 |
| WO | WO-2005119791 | | 12/2005 |

OTHER PUBLICATIONS

International Search Report & Written Opinion mailed Apr. 15, 2010 for PCT Application No. PCT/US2009/006465.

* cited by examiner

*Primary Examiner* — Mohammed Hasan
(74) *Attorney, Agent, or Firm* — Blakely, Sokoloff, Taylor & Zafmann LLP

(57) ABSTRACT

An image sensor includes a first sensor layer having a first array of pixels and a second sensor layer having a second array of pixels. Each of the pixels has an optical center. The first sensor layer is stacked over the second sensor layer such that the optical centers of the first array of pixels are offset from the optical centers of the second array to form a predetermined pattern.

23 Claims, 10 Drawing Sheets

11
ND FILTER 13
SHUTTER 18
LENS 12
IRIS 14
10
28
20
22
24
DSP MEMORY
32
30
IMAGE SENSOR
ANALOG SIGNAL PROCESSOR
A/D
57
DIGITAL SIGNAL PROCESSOR
HOST INTERFACE
16
TIMING GENERATOR
26
BRIGHTNESS SENSOR
38
40
50
36
38
52
EXPOSURE CONTROLLER
SYSTEM CONTROLLER
54
56
60
62
64
PROGRAM MEMORY
SYSTEM MEMORY
MEMORY CARD INTERFACE
MEMORY CARD
88
VIEWFINDER DISPLAY
EXPOSURE DISPLAY
USER INPUTS
STATUS DISPLAY
VIDEO ENCODER
DISPLAY CONTROLLER
IMAGE DISPLAY
70
72
74
76
80
82
68

IMAGE SENSOR HAVING MULTIPLE SENSING LAYERS

FIELD OF THE INVENTION

The invention relates generally to the field of image sensors, and more particularly to an image sensor having multiple sensing layers.

BACKGROUND OF THE INVENTION

A typical image sensor has an image sensing portion that includes a photosensitive area for collecting a charge in response to incident light. Typically, these images sensors include a number of light sensitive pixels, often arranged in a regular pattern of rows and columns. Each pixel includes a photosensor, such as a photodiode, that produces a signal corresponding to the intensity of light impinging on that pixel when an image is focused on the array.

One type of image sensor is a Complementary Metal Oxide Semiconductor (CMOS) image sensor, in which the image sensing portion includes a photodiode for collecting charge and a transfer gate for transferring the charge from the photodiode to a charge-to-voltage conversion mechanism, such as a floating diffusion. Usually, the sensing portion and the control circuitry for the image sensor are fabricated within a single material layer.

In an effort to increase the number of pixels provided in an image sensor, pixel size has been decreasing. An advantage of moving to smaller pixels is that it increases the resolution of the image for a fixed optical format. Specifically, smaller pixels have a better modulation transfer function (MTF), and can thus discriminate fine details in an image, such the lines on a finely striped shirt.

However, as pixels made using CMOS processes scale to smaller dimensions, several performance properties of the imagers using these pixels can degrade. Particularly, optical sensitivity (OS) degrades quickly. This is because both the quantum efficiency (QE) degrades with decreasing aperture size, and the pixel area also shrinks. Because OS depends on the product of QE and pixel area, OS is negatively impacted by both.

Thus, a need exists for an improved image sensor structure.

SUMMARY OF THE INVENTION

Embodiments of an image sensor are disclosed, where the image sensor includes a first sensor layer having a first array of pixels and a second sensor layer having a second array of pixels. Each of the pixels has an optical center. The optical center is the center of a pixel in one embodiment in accordance with the invention. The first sensor layer is stacked over the second sensor layer such that the optical centers of the first array of pixels are offset from the optical centers of the second array to form a predetermined pattern.

The present invention has the advantage of providing an improved image sensor structure.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION OF THE INVENTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
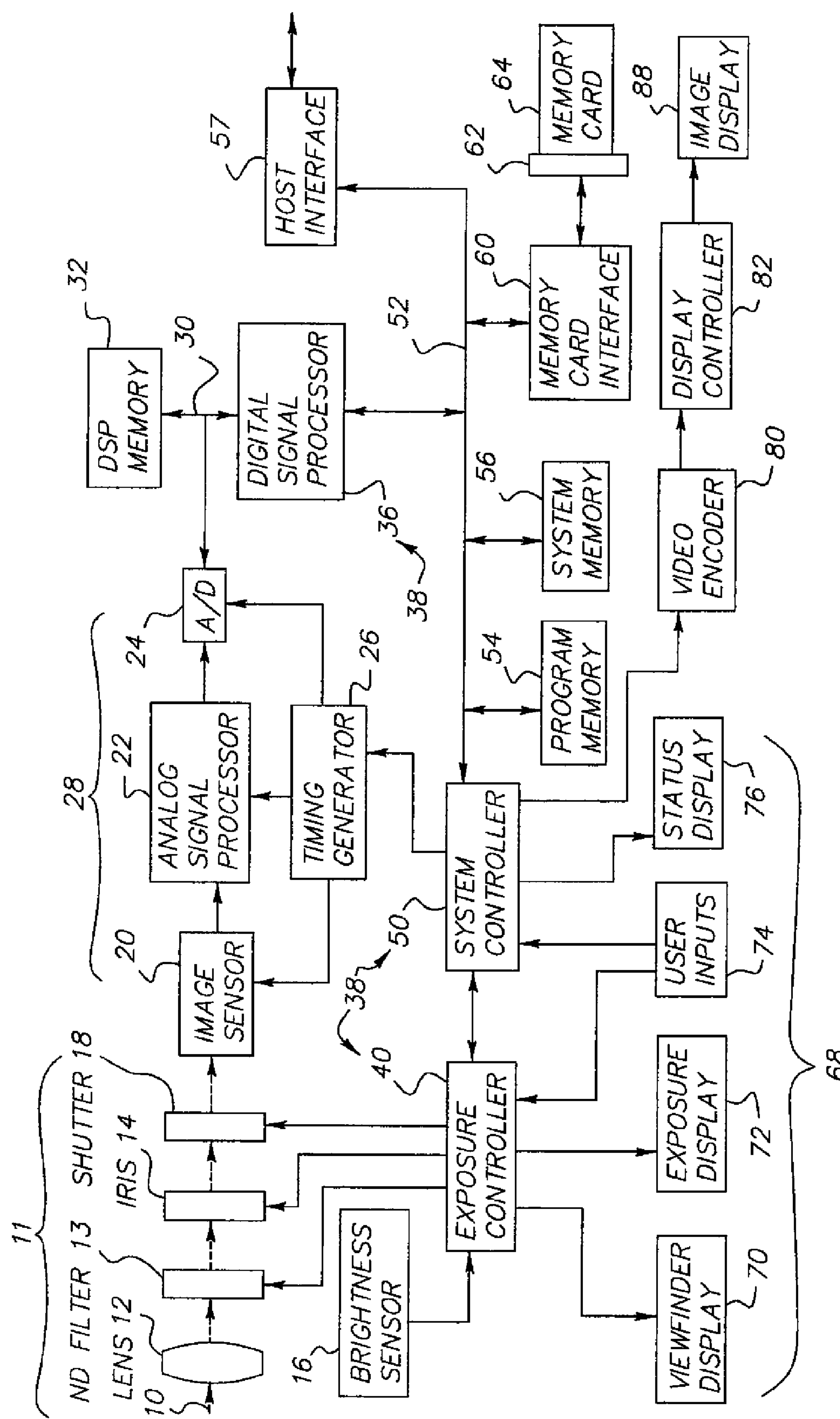
FIG. 1 is a block diagram illustrating aspects of an embodiment of a digital camera.

Turning now to FIG. 1, a block diagram of an image capture device shown as a digital camera embodying aspects of the present disclosure is illustrated. Although a digital camera is illustrated and described, the present invention is clearly applicable to other types of image capture devices. In the disclosed camera, light 10 from a subject scene is input to an imaging stage 11, where the light is focused by a lens 12 to form an image on an image sensor 20. The image sensor 20 converts the incident light to an electrical signal for each picture element (pixel). In some embodiments, the image sensor 20 is an active pixel sensor (APS) type (APS devices are often referred to as CMOS sensors because of the ability to fabricate them in a Complementary Metal Oxide Semiconductor process).

The amount of light reaching the sensor 20 is regulated by an iris block 14 that varies the aperture and the neutral density (ND) filter block 13 that includes one or more ND filters interposed in the optical path. Also regulating the overall light level is the time that the shutter block 18 is open. The exposure controller block 40 responds to the amount of light available in the scene as metered by the brightness sensor block 16 and controls all three of these regulating functions.

This description of a particular camera configuration will be familiar to one skilled in the art, and it will be apparent to such a skilled person that many variations and additional features are present. For example, an autofocus system is added, or the lens is detachable and interchangeable. It will be understood that the present disclosure applies to various types of digital cameras where similar functionality is provided by alternative components. For example, the digital camera is a relatively simple point and shoot digital camera, where the shutter 18 is a relatively simple movable blade shutter, or the like, instead of the more complicated focal plane arrangement. Aspects of the present invention can also be practiced on imaging components included in non-camera devices such as mobile phones and automotive vehicles.

An analog signal from the image sensor 20 is processed by an analog signal processor 22 and applied to an analog to digital (A/D) converter 24. A timing generator 26 produces various clocking signals to select rows and pixels and synchronizes the operation of the analog signal processor 22 and the A/D converter 24. The image sensor stage 28 includes the image sensor 20, the analog signal processor 22, the A/D converter 24, and the timing generator 26. The components of the image sensor stage 28 can be separately fabricated integrated circuits, or they could be fabricated as a single integrated circuit as is commonly done with CMOS image sensors. The resulting stream of digital pixel values from the A/D converter 24 is stored in a memory 32 associated with the digital signal processor (DSP) 36.

The digital signal processor 36 is one of three processors or controllers in the illustrated embodiment, in addition to a system controller 50 and an exposure controller 40. Although this partitioning of camera functional control among multiple controllers and processors is typical, these controllers or processors are combined in various ways without affecting the functional operation of the camera and the application of the present invention. These controllers or processors can comprise one or more digital signal processor devices, microcontrollers, programmable logic devices, or other digital logic circuits. Although a combination of such controllers or processors has been described, it should be apparent that one controller or processor can be designated to perform all of the needed functions. All of these variations can perform the same function and fall within the scope of this invention, and the term "processing stage" will be used as needed to encompass all of this functionality within one phrase, for example, as in processing stage 38 in FIG. 1.

In the illustrated embodiment, the DSP 36 manipulates the digital image data in its memory 32 according to a software program permanently stored in program memory 54 and copied to the memory 32 for execution during image capture. The DSP 36 executes the software necessary for practicing image processing. The memory 32 includes of any type of random access memory, such as SDRAM. A bus 30 comprising a pathway for address and data signals connects the DSP 36 to its related memory 32, A/D converter 24 and other related devices.

The system controller 50 controls the overall operation of the camera based on a software program stored in the program memory 54, which can include Flash EEPROM or other nonvolatile memory. This memory can also be used to store image sensor calibration data, user setting selections and other data which must be preserved when the camera is turned off. The system controller 50 controls the sequence of image capture by directing the exposure controller 40 to operate the lens 12, ND filter 13, iris 14, and shutter 18 as previously described, directing the timing generator 26 to operate the image sensor 20 and associated elements, and directing the DSP 36 to process the captured image data. After an image is captured and processed, the final image file stored in memory 32 is transferred to a host computer via an interface 57, stored on a removable memory card 64 or other storage device, and displayed for the user on an image display 88.

A bus 52 includes a pathway for address, data and control signals, and connects the system controller 50 to the DSP 36, program memory 54, system memory 56, host interface 57, memory card interface 60 and other related devices. The host interface 57 provides a high speed connection to a personal computer (PC) or other host computer for transfer of image data for display, storage, manipulation or printing. This interface is an IEEE1394 or USB2.0 serial interface or any other suitable digital interface. The memory card 64 is typically a Compact Flash (CF) card inserted into a socket 62 and connected to the system controller 50 via a memory card interface 60. Other types of storage that are utilized include, for example, PC-Cards, MultiMedia Cards (MMC), or Secure Digital (SD) cards.

Processed images are copied to a display buffer in the system memory 56 and continuously read out via a video encoder 80 to produce a video signal. This signal is output directly from the camera for display on an external monitor, or processed by the display controller 82 and presented on an image display 88. This display is typically an active matrix color liquid crystal display (LCD), although other types of displays are used as well.

The user interface, including all or any combination of viewfinder display 70, exposure display 72, status display 76 and image display 88, and user inputs 74, is controlled by a combination of software programs executed on the exposure controller 40 and the system controller 50. User inputs 74 typically include some combination of buttons, rocker switches, joysticks, rotary dials or touchscreens. The exposure controller 40 operates light metering, exposure mode, autofocus and other exposure functions. The system controller 50 manages the graphical user interface (GUI) presented on one or more of the displays, for example, on the image display 88. The GUI typically includes menus for making various option selections and review modes for examining captured images.

The exposure controller 40 accepts user inputs selecting exposure mode, lens aperture, exposure time (shutter speed), and exposure index or ISO speed rating and directs the lens and shutter accordingly for subsequent captures. The brightness sensor 16 is employed to measure the brightness of the scene and provide an exposure meter function for the user to refer to when manually setting the ISO speed rating, aperture and shutter speed. In this case, as the user changes one or more settings, the light meter indicator presented on viewfinder display 70 tells the user to what degree the image will be over or underexposed. In an automatic exposure mode, the user changes one setting and the exposure controller 40 automatically alters another setting to maintain correct exposure. For example, for a given ISO speed rating when the user reduces the lens aperture, the exposure controller 40 automatically increases the exposure time to maintain the same overall exposure.

The image sensor 20 shown in FIG. 1 includes an array of light sensitive pixels fabricated on a substrate that provide a way of converting incoming light at each pixel into an electrical signal that is measured. As the sensor is exposed to light, free electrons are generated and captured within the electronic structure at each pixel. The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or above the base semiconductor structure or foundation. In addition, the semiconductor need not be silicon-based, but could be based on silicon-germanium, germanium, or gallium arsenide.

Figure 2:
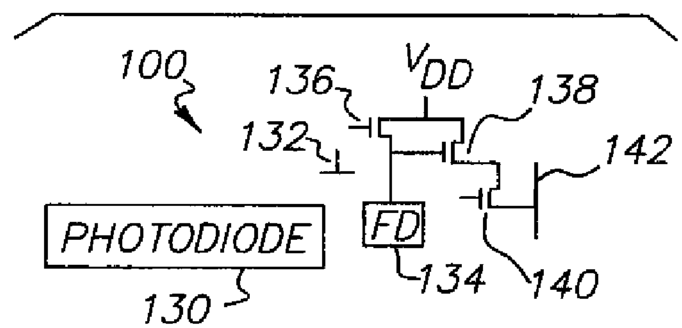
FIG. 2 is a schematic diagram illustrating portions of a non-shared pixel for an image sensor.

FIG. 2 is a schematic diagram illustrating portions of an embodiment of a non-shared pixel 100 of the image sensor 20. The pixel 100 includes a photodetector, such as a photodiode 130 and a transfer mechanism, such as a transfer gate 132. The photodetector 130 collects charge in response to incident light and the transfer gate 132 functions to transfer charge from the photodetector 130 to a charge-to-voltage mechanism, such as a floating diffusion sense node 134, which receives the charge from the photodetector 130 and converts the charge to a voltage signal. A reset gate transistor 136 and a source follower amplifier transistor 138 have their drains coupled to a voltage source $V_{DD}$. A row select transistor 140 has its drain connected to the source of the source follower transistor 138 and its source connected to an output line 142. The source of the reset gate 136 and the gate of source follower 138 are connected to the floating diffusion 134.

Figure 3:
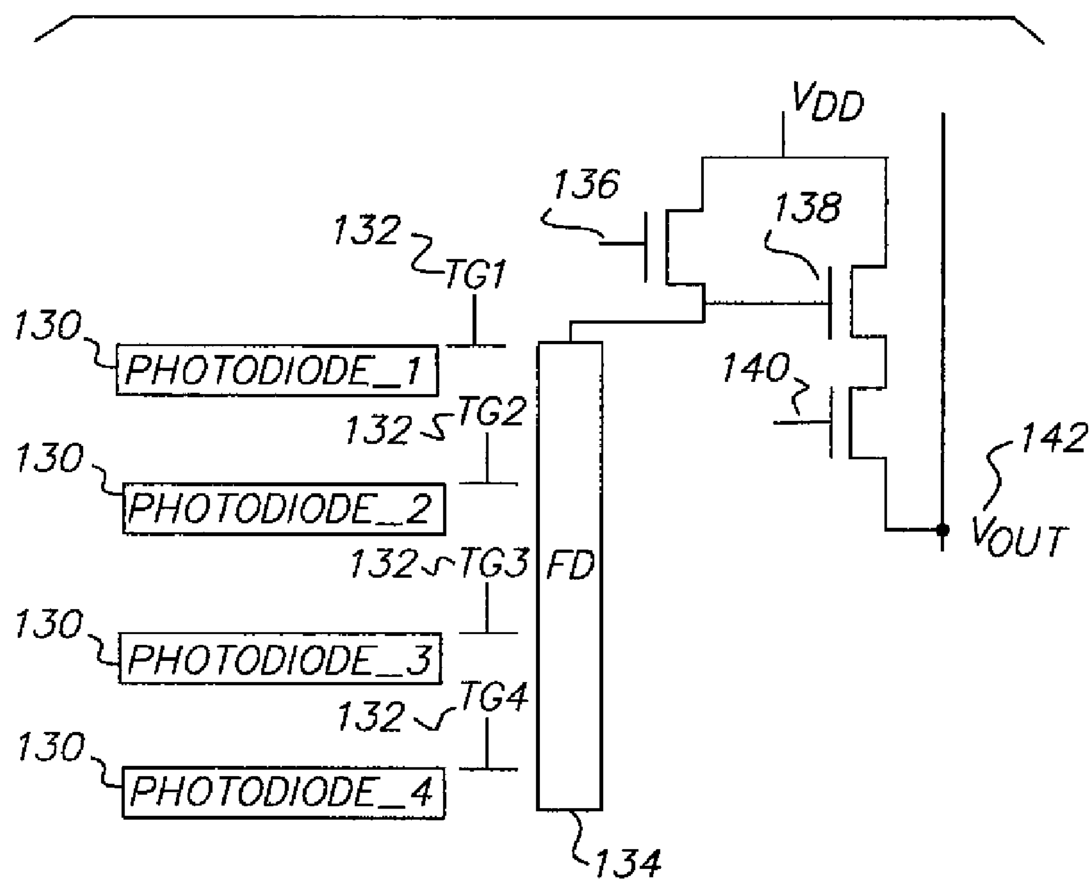
FIG. 3 is a schematic diagram illustrating portions of an embodiment of a 4-shared pixel for an image sensor.

FIG. 3 is a schematic diagram illustrating portions of an embodiment using a 4-shared pixel structure of the image sensor 20. With a 4-shared structure, photo-induced charge that is collected in the 4-photodiodes is controlled by one of 4-transfer gates 132, into a single floating diffusion 134. The 4-photodiodes 130, the transfer gates 132, the floating diffusion 134, and the readout transistors 136, 138, and 140, are referred to generally as the pixel kernel. In other embodiments, other kernel configurations are used, such as non-shared, 2-shared, 4-shared, or N-shared. Some embodiments disclosed herein use a 4-shared architecture for each of the two sensing layers.

Figure 4:
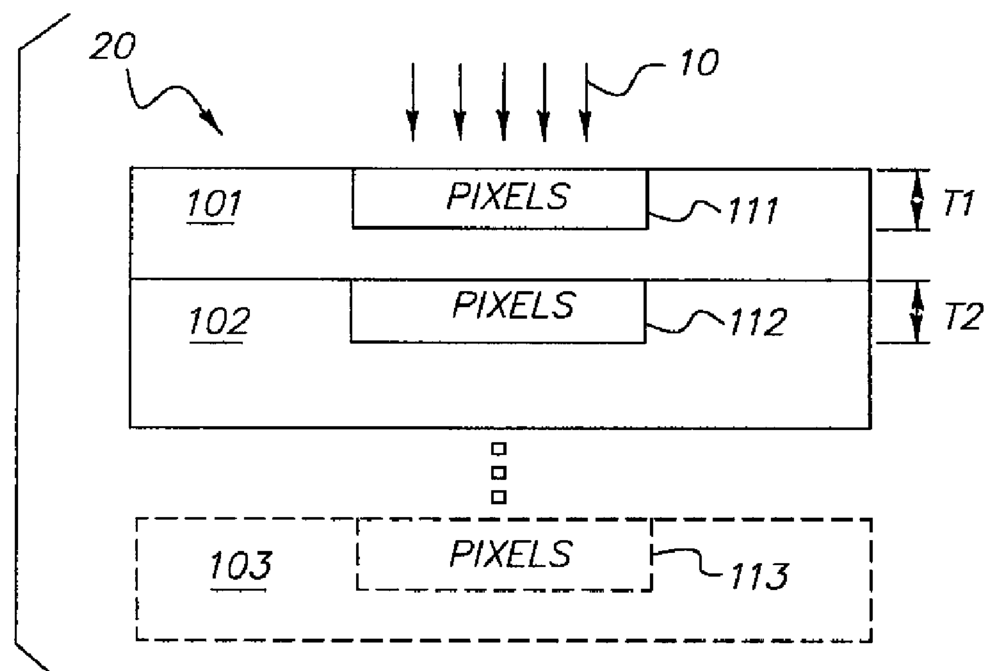
FIG. 4 conceptually illustrates an embodiment of an image sensor with two sensing layers.

In FIG. 4, the image sensor 20 includes a plurality of sensor layers, with each sensor layer having an array of pixels. For example, the embodiment illustrated in FIG. 4 includes first and second sensor layers 101,102, with a third or additional layers 103 indicated by broken lines. Each layer has a corresponding array of pixels 111, 112, 113.

The first sensor layer 111 has an effective thickness T1 to collect light with a first preselected range of wavelengths and the second sensor layer has an effective thickness T2 to collect light with a second preselected range of wavelengths. In embodiments with additional sensing layers, such as the layer 103, etc. have corresponding effective thicknesses to collect additional preselected ranges of wavelengths.

Regular silicon wafers, silicon on insulator (SOI) wafers or silicon on sapphire (SOS) wafers are all suitable materials for manufacture of the sensor layers 101, 102, etc. Support circuitry for addressing and reading out the pixel arrays are typically on the sensing layers outside the array of pixels 111, 112. In another configuration, the support circuitry is fabricated on an additional substrate, attached beneath the lowest sensing layer, and electrically connected to the sensing layers via electrical interconnects.

Figure 5:
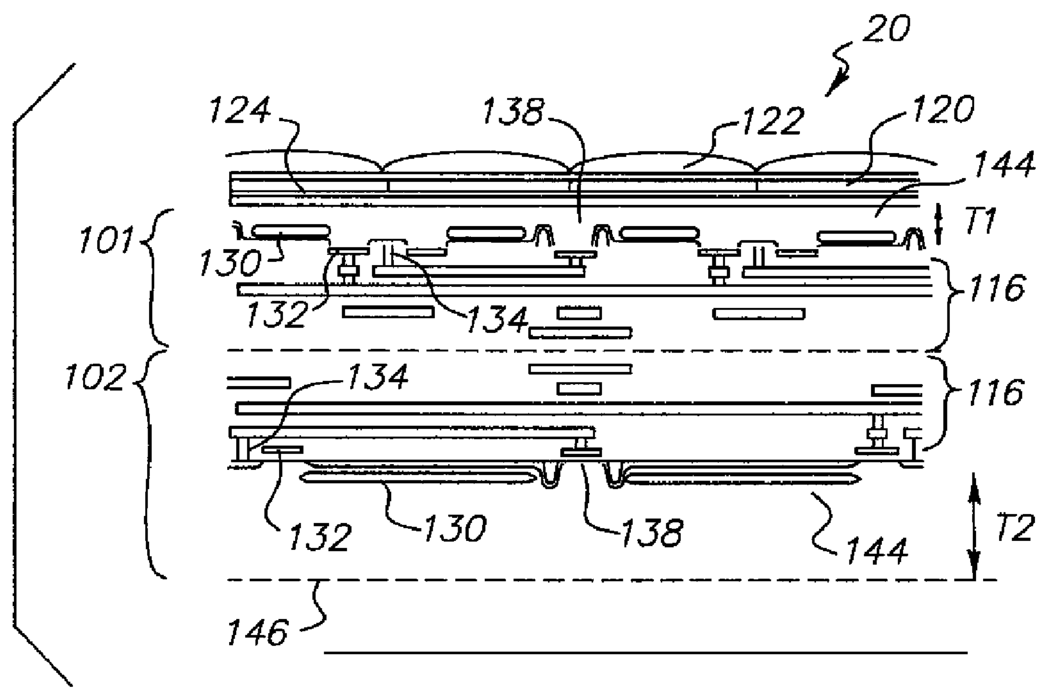
FIG. 5 is a side view conceptually illustrating aspects of an embodiment of an image sensor with two sensing layers.

FIG. 5 is a cross-section view showing further aspects of an embodiment of an image sensor having two sensor layers 101 and 102. Each of the sensor layers 101, 102 include a semiconducting portion 144, of "effective thickness" T1 and T2 respectively. If the semiconducting portion 144 of the top layer 101 is silicon then T1 is typically between 0.4 um and 2.5 um. This thickness range is set to absorb as much light from the blue and green visible bands, while allowing a significant amount of red light (>25%) to pass to the second sensor layer 102. The "effective thickness" of T2 is usually larger than T1, typically between 2.5 um to 10 um, and designed to absorb red light. The bottom edge of T2 is commonly referred to as the collection depth 146. In some embodiments employing additional sensing layers, each additional layer has a further effective thickness to absorb corresponding ranges of wavelengths.

Upon readout, photocharge collected in the photodiode 130 is moved to the floating diffusion 134 by applying a pulse to the transfer gate 132. The voltage signal generated at the gate of the source follower transistor 138 is transfer via column lines to the support circuitry. A color filter array (CFA) 120 is situated over the first sensor layer 101, and a microlens 122 is formed over the CFA 120 with a spacing layer 124 between the CFA 120 and microlens 122 in some embodiments. For the cross section shown, the pixel pitch is half that for the first sensing layer 101 compared to the second sensing layer 102.

Figure 6:
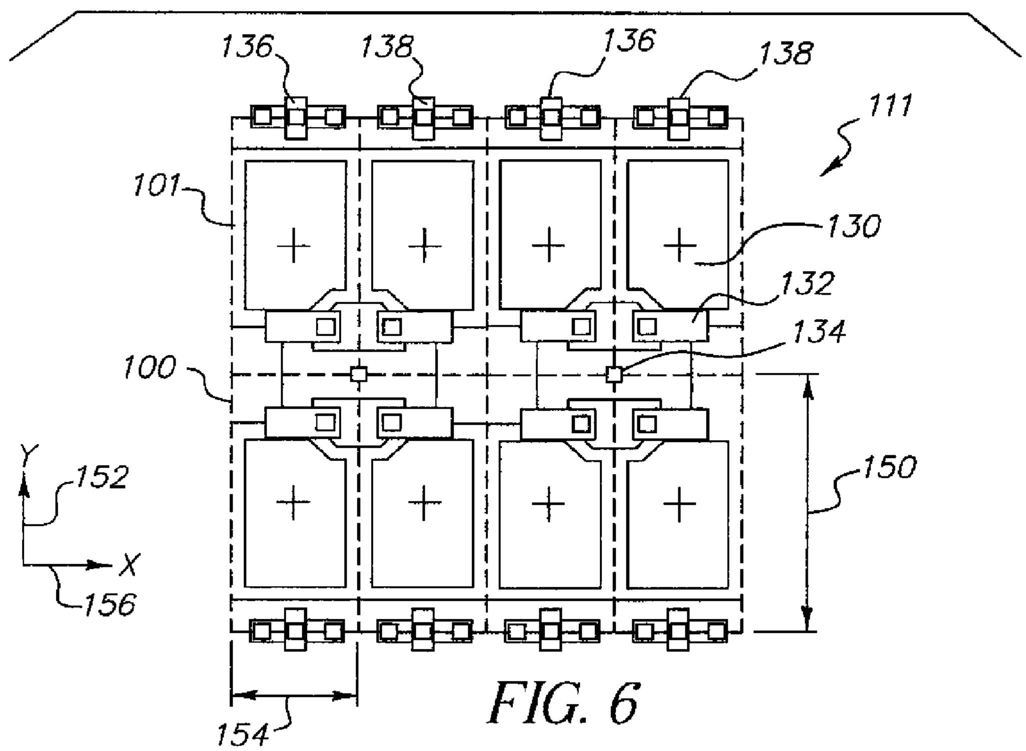
FIG. 6 is a top view illustrating portions of an embodiment of a first sensor layer with a smaller pixel pitch in the x-direction compared to the y-direction.
Figure 7:
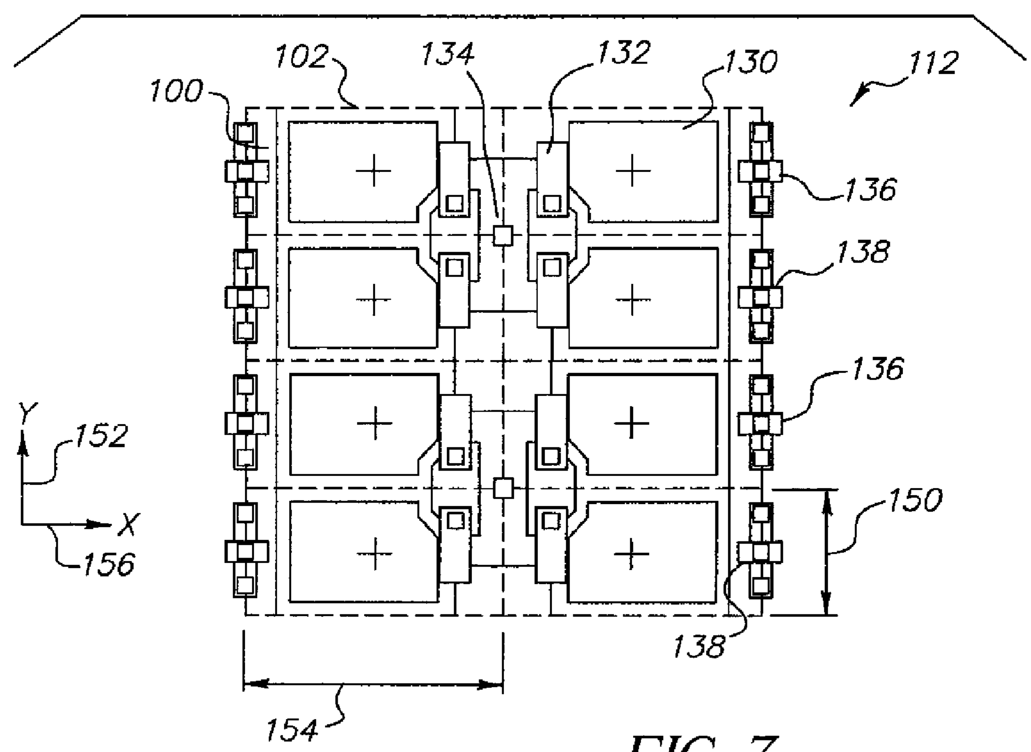
FIG. 7 is a top view illustrating portions of an embodiment of a second sensor layer with a larger pixel pitch in the x-direction compared to the y-direction.

FIGS. 6 and 7 are top views illustrating portions of the first and second sensor layers 101, 102, respectively. Referring to FIG. 6, the first array 111 has a first spatial pitch 150 in a first direction (y or horizontal) 152, and a second spatial pitch 154 in a second (x or vertical) direction 156. In the illustrated embodiment, the first direction 152 is generally perpendicular to the second direction 156. In this disclosure, the term pitch generally refers to the distance between a point on one pixel and the corresponding point on an adjacent pixel. In the first array 111, the first spatial pitch 150 is larger than the second spatial pitch 154.

FIG. 7 illustrates the second array 112, in which the second spatial pitch 154 of the pixels 100 in the second direction 156 is larger than the first spatial pitch 150 in the first direction 152.

Figure 8:
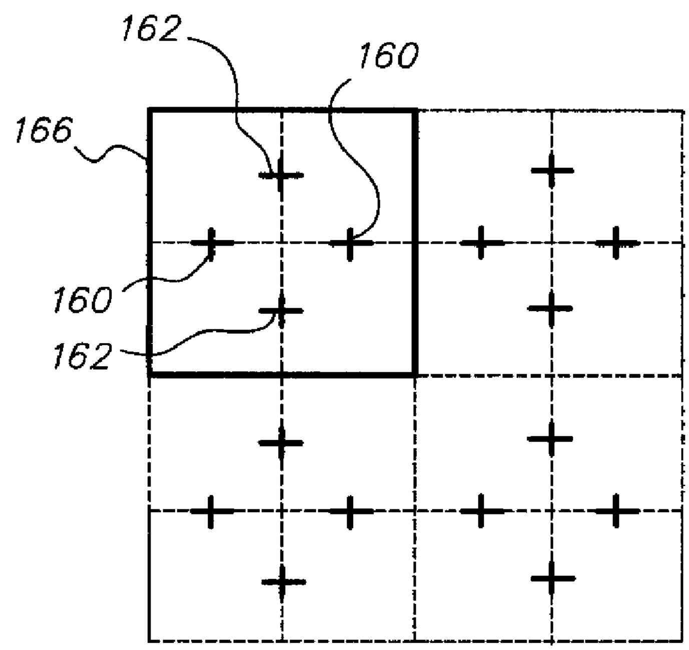
FIG. 8 is a top view of alignment positions of optical centers of pixels for the first and second sensor layers illustrated in FIGS. 6 and 7.

FIG. 8 illustrates an overlay of the optical centers 160 of some of the photodiodes 130 of the first layer 101 and the optical centers 162 of photodiodes 130 of the second layer 102. The dark black square 166 marks an effective 2×2 pixel kernel for color reconstruction. Although the optical centers 160, 162 are not at the centers of the subsquares within the 2×2 block 166, the period of the repeat unit is identical to that of a 2×2 Bayer kernel of identical dimension.

Each image has better modulation transfer function (TF) performance in a different direction. The final image has a higher MTF than for each of the separate images. The effective pixel area for each image is larger than that for an image generated with a single sensing layer with equivalent MTF performance. Therefore the optical sensitivity (OS) is also greater.

In some embodiments, such as the embodiment illustrated in FIG. 5, the image sensor 20 is a back side illuminated sensor where exposed light is projected towards the back side surface of the silicon layer 114. The pixels 100 are located on the opposite side of the substrate, which is thin enough so that light projected towards the backside of the substrate can reach the pixels 100.

To maximize the light collected by the photodiodes 130 in the second sensing layer 102, layout of the metal wiring 116 for both the first sensing layer and second sensing layer should maximize the aperture (non-metal area) above the photodiodes 130 for the second sensing layer 102. In practice, apertures are larger for N-shared designs compared to non-shared designs since fewer metal wires are required to readout the photodiode signal.

Figure 9:
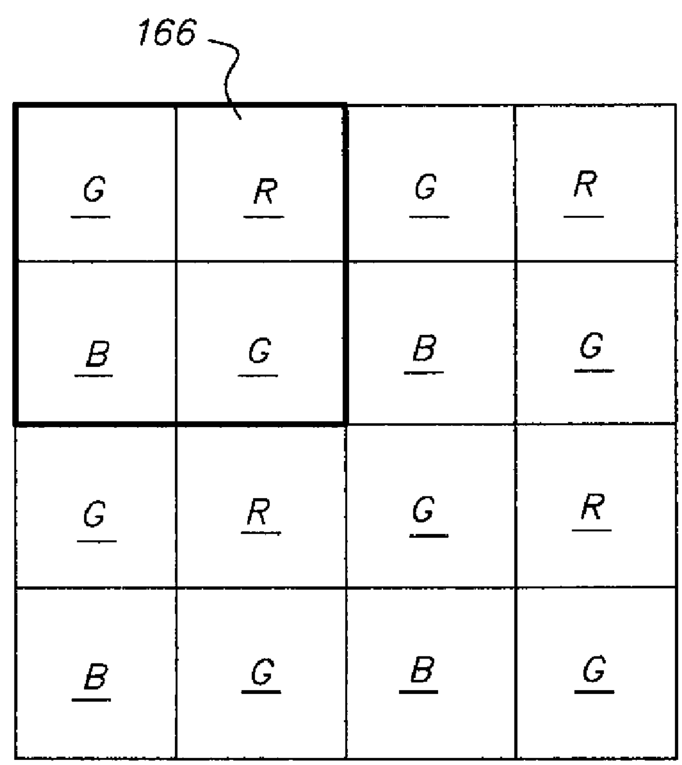
FIG. 9 conceptually illustrates a pattern of color filters used in a Bayer color filter array.

In order to produce a color image, the array of pixels in an image sensor typically has a pattern of color filters placed over them. FIG. 9 illustrates a pattern of red, green, and blue color filters that is commonly used for imagers of a single sensing layer. This particular pattern is commonly known as a Bayer color filter array (CFA) after its inventor Bryce Bayer as disclosed in U.S. Pat. No. 3,971,065, which is incorporated by reference. As a result, each pixel has a particular color photoresponse that, in this case, is a predominant sensitivity to red, green or blue light.

Figure 10:
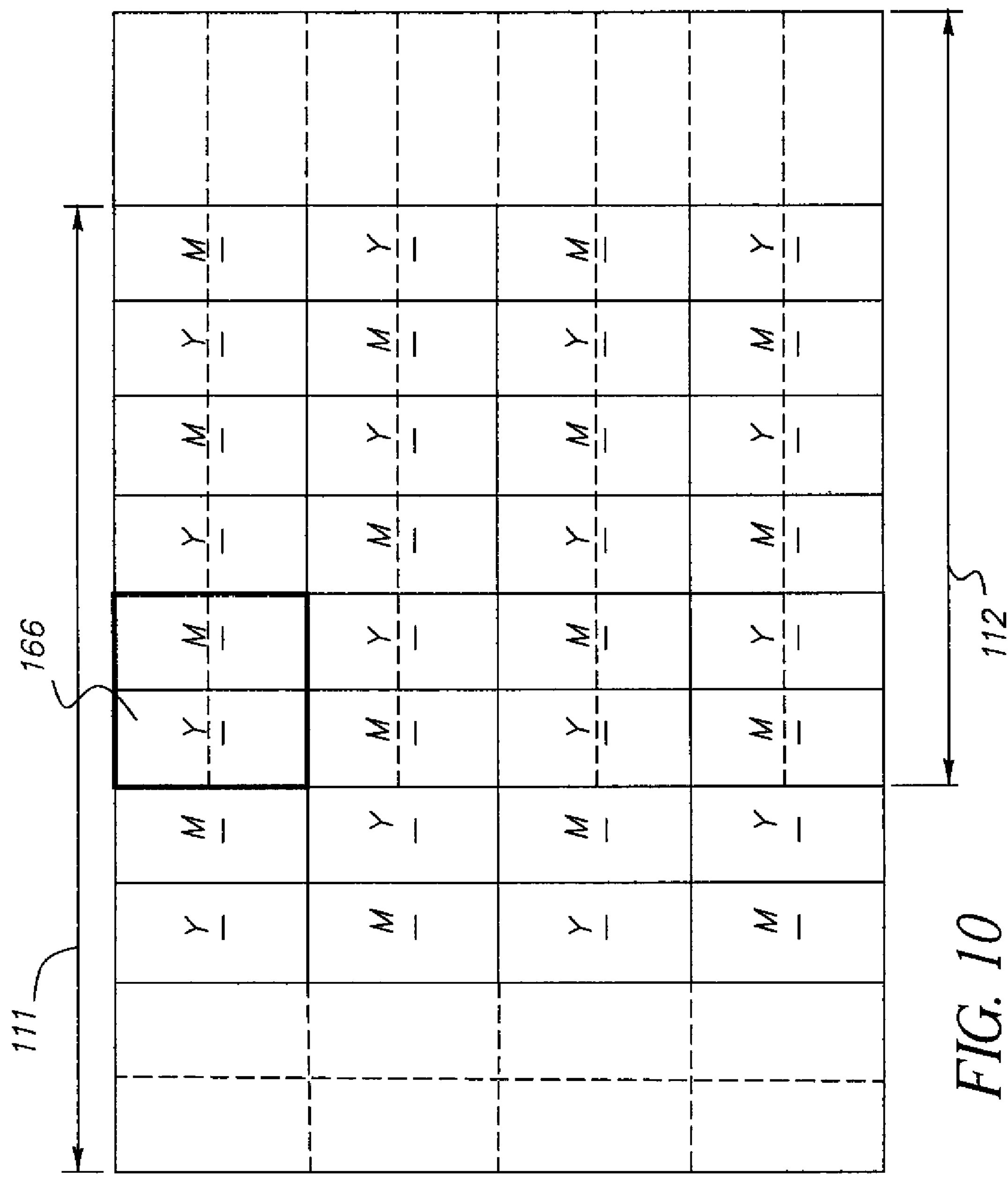
FIG. 10 illustrates an overlay of the first and second sensor layers illustrated in FIGS. 5 and 6, respectively, and an embodiment of a color filter array used for such an overlay.

FIG. 10 illustrates an example of an embodiment of a CFA pattern for an imager with two sensing layers such as the embodiment illustrated in FIG. 5. Unlike the Bayer pattern, yellow and magenta filters are required to separate light from the blue (magenta) and green (yellow) spectral bands for the top pixel array 111, while allowing red light to pass to the second pixel array 112, which will be sensitive primarily to red light. Because of the two sensing layers, the pixel kernel for color image reconstruction 166 is smaller than the Bayer color kernel. In addition, the optical sensitivity is much higher than that for the Bayer color kernel.

Figure 11A:
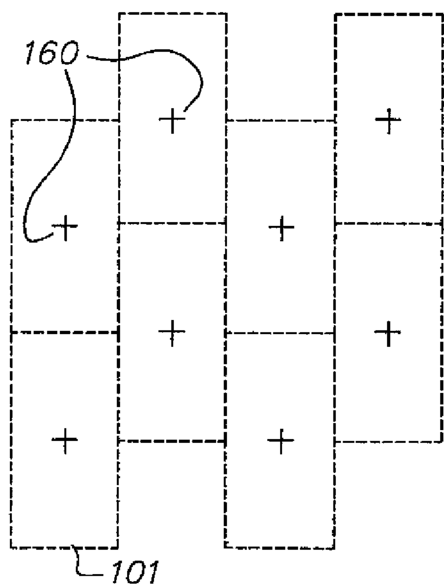
FIG. 11*a* is a top view of the alignment positions of optical centers of pixels for the first sensor layer where for each column the optical centers are staggered.
Figure 11B:
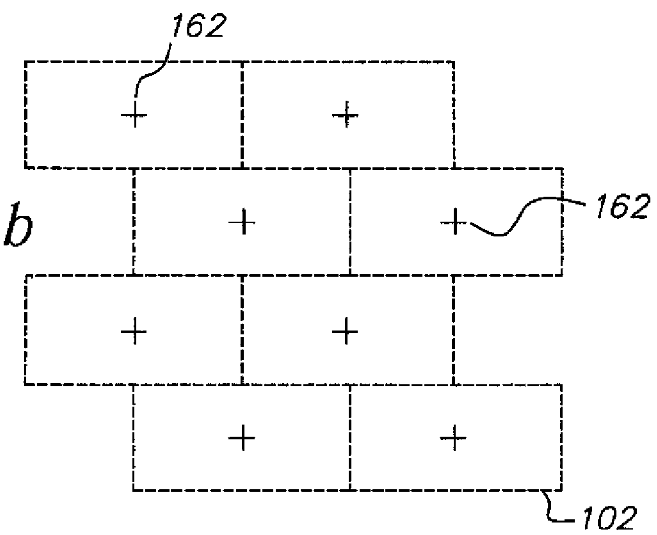
FIG. 11*b* is a top view of the alignment positions of optical centers of pixels for the second sensor layer where for each row the optical centers are staggered.
Figure 11C:
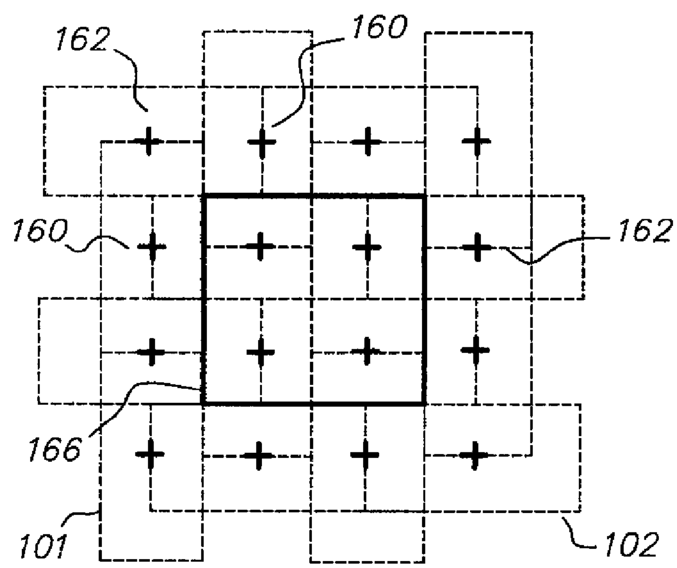
FIG. 11*c* is a top view of the overlay of FIGS. 11*a* and 11*b*, illustrating that the optical centers of the first and second sensor layers form a square array.

FIG. 11 illustrates an embodiment where the overlay of the optical centers form a square lattice. FIG. 11*a* is a top view of the alignment positions of optical centers of pixels for the first sensor layer 101 where for each column the optical centers are staggered. FIG. 11*b* is a top view for the second sensor layer 102 where each row is staggered. FIG. 11*c* illustrates the overlay and the formation of the square lattice. Again, the dark black square 166 marks an effective 2×2 pixel kernel for color reconstruction.

Figure 12B:
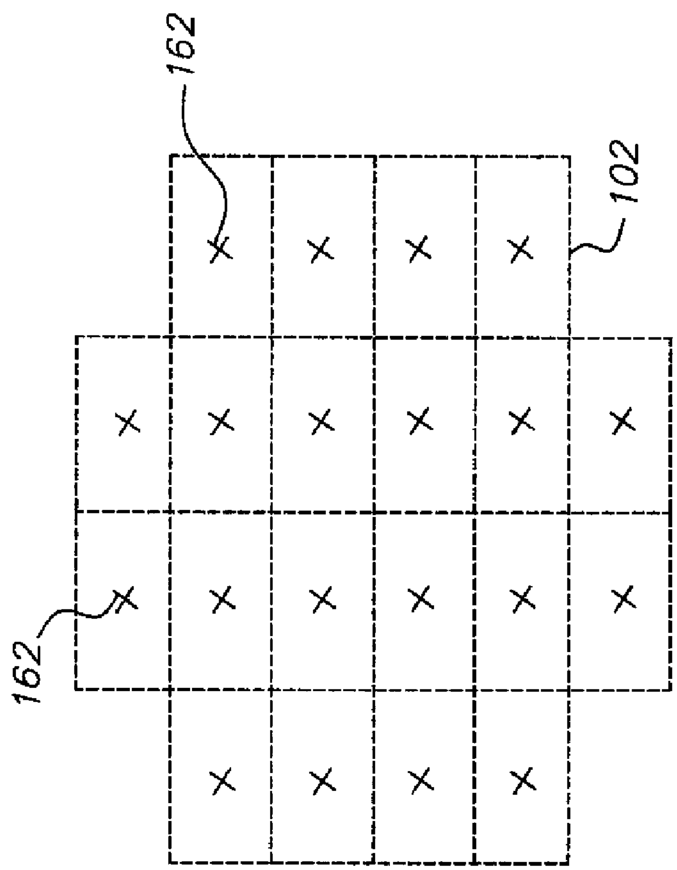
FIG. 12*b* is a top view of the alignment positions of optical centers of pixels for the second sensor layer.
Figure 12A:
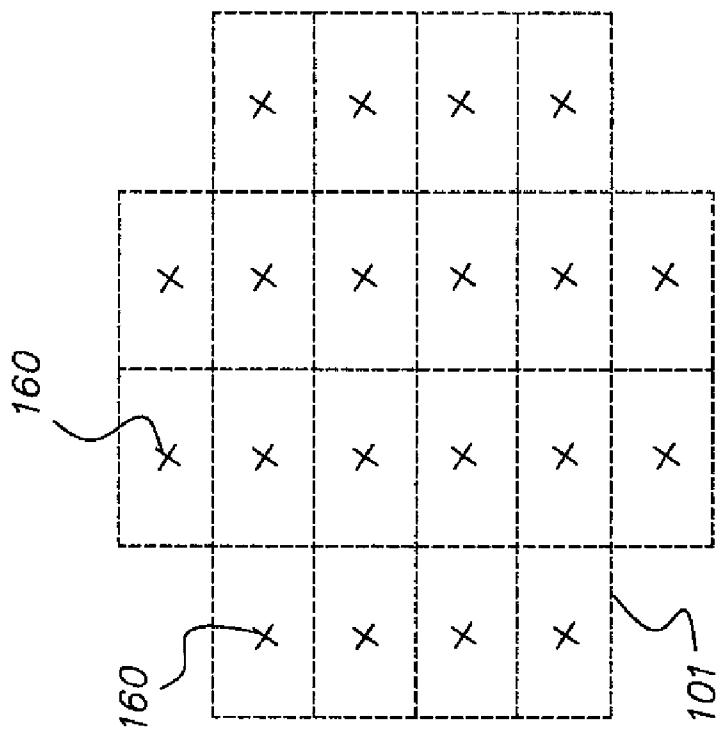
FIG. 12*a* is a top view of the alignment positions of optical centers of pixels for the first sensor.
Figure 12C:
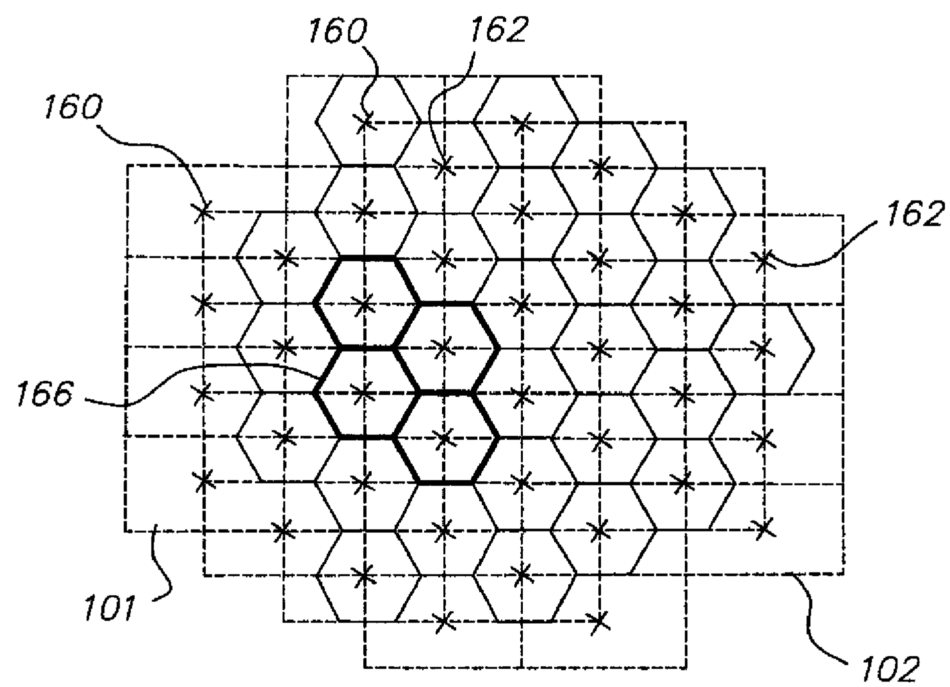
FIG. 12*c* is a top view of the overlay of FIGS. 12*a* and 12*b*, illustrating that the optical centers of the first and second sensor layers form a close-packed 2D array.

Similarly, FIG. 12 illustrates an embodiment where the overlay of the optical centers form a close-packed lattice. FIG. 12*a* is a top view of the alignment positions of optical centers of pixels for the first sensor layer where the optical centers form a rectangular grid. FIG. 12*b* shows the same rectangular grid for the second sensor layer. FIG. 12*c* illustrates that overlaying the two grids with an offset gives a close-packed lattice. Again, the dark black square 166 marks an effective 2×2 pixel kernel for color reconstruction.

Figure 13:
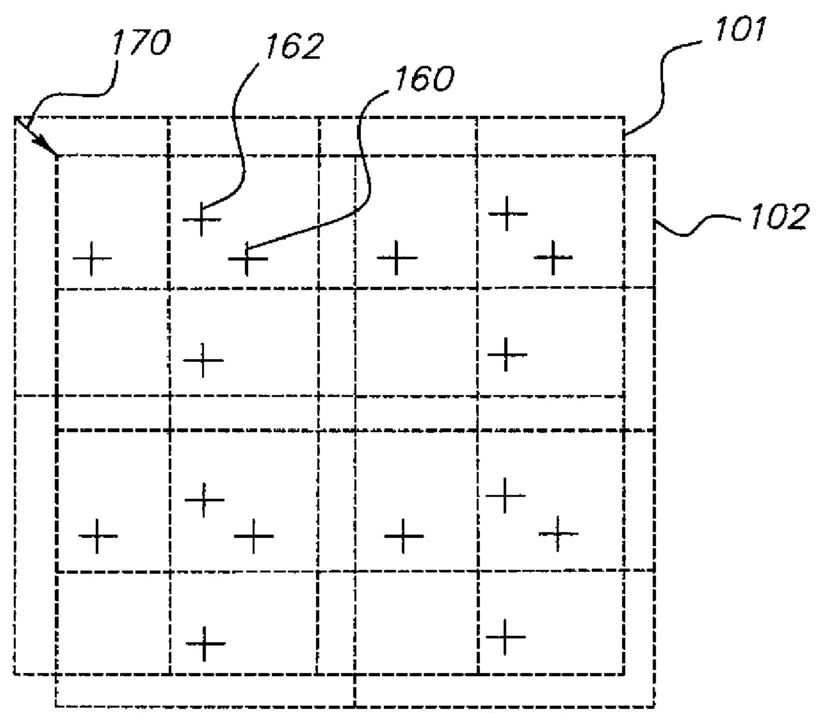
FIG. 13 illustrates potential misalignment between the sensor layers.
Figure 14:
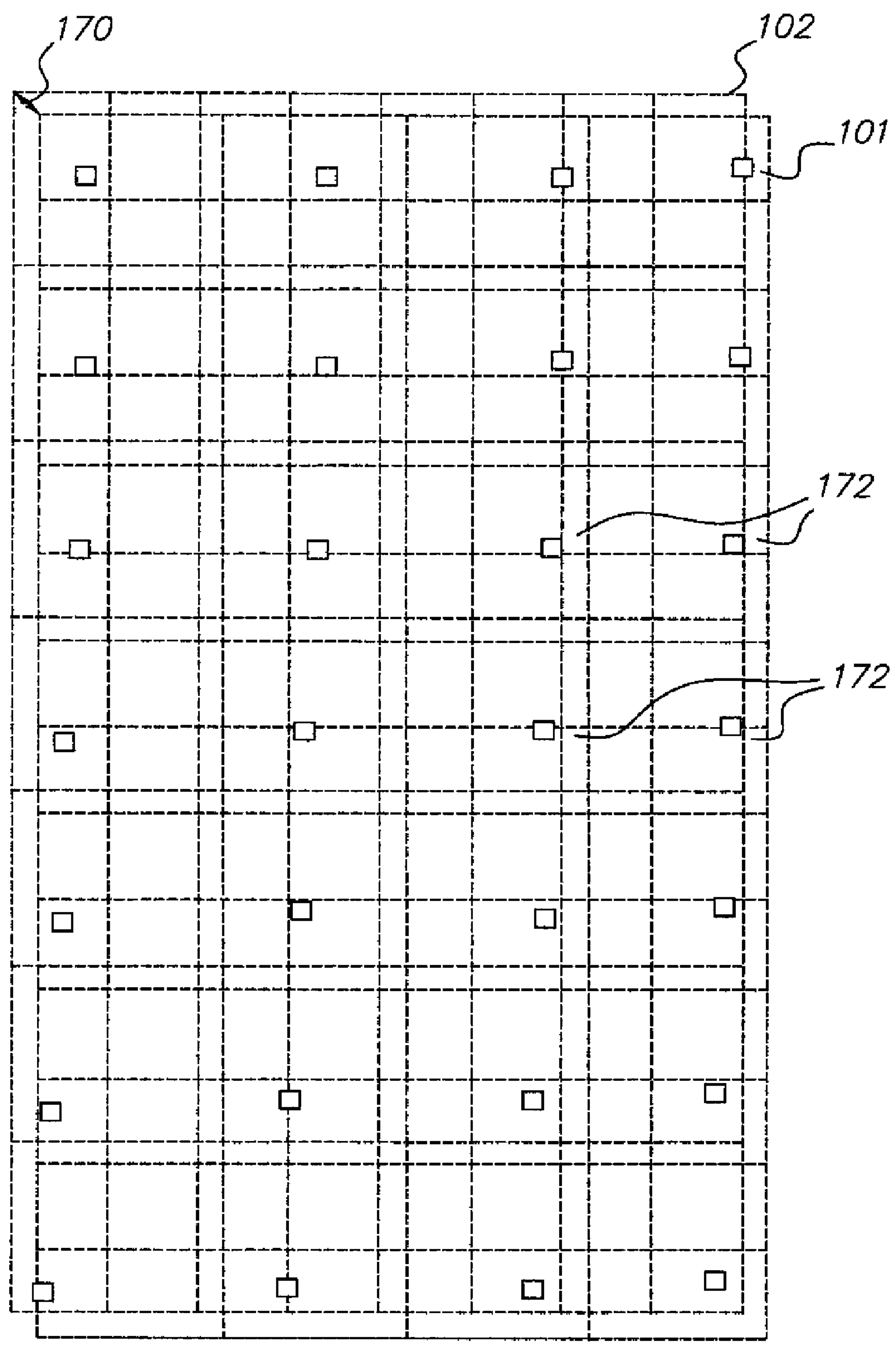
FIG. 14 is a top view of a sensor layer including an alignment structure.

An issue in the fabrication of a multilayer structure such as the image sensor 20 illustrated in FIGS. 5-8 is misalignment during the wafer-to-wafer bonding stage. FIG. 13 illustrates an example of such potential misalignment 170 between the first layer 101 and the second layer 102. The misalignment in the images can be easily corrected if the misalignment is known. Accordingly, some embodiments include verniers or another alignment mark on one of the sensor layers, for example, the first layer 101. FIG. 14 illustrates an example of such an alignment structure. The first sensor layer 101 includes openings 172 through one of the metal layers 116. These alignment structures are typically placed in one or more of the corners of the image sensor 20. After fabrication, the misalignment is measured by illuminating the image sensor with uniform light. Light coming through the openings 170 in the first sensor layer 101 is imaged with a portion of the second pixel array 112 of the second layer 102. Analysis of the image under the alignment structure provides offset and rotational misalignment information that can be used to calibrate the image sensor.

The invention has been described in detail with particular reference to certain preferred embodiments thereof, but it will be understood that variations and modifications can be effected within the spirit and scope of the invention.

PARTS LIST

10 light
11 imaging stage
12 lens
13 ND filter block
14 iris block
16 brightness sensor block
18 shutter block
20 image sensor
22 analog signal processor
24 analog to digital (A/D) converter
26 timing generator
28 image sensor stage
30 bus
32 memory
36 digital signal processor (DSP)
38 processing stage
40 exposure controller
50 system controller
52 bus
54 program memory
56 system memory
57 host interface
60 memory card interface
62 socket
64 memory card
70 viewfinder display
72 exposure display
74 user inputs
76 status display
80 video encoder
82 display controller
88 image display
100 pixel
101 first sensing layer
102 second sensing layer
111 first pixel array
112 second pixel array
114 substrate
116 metal layers
120 color filter array (CFA)
122 microlens
124 spacing layer
130 photodiode
132 transfer gate
134 floating diffusion
136 reset gate transistor
138 source follower transistor
140 row select transistor
142 output line
144 semiconductor layer
146 photodiode charge collection depth
150 first spatial pitch
152 first direction

154 second spatial pitch
156 second direction
160 photodiode optical center
162 photodiode optical center
164 pixel kernel
166 pixel kernel for color image reconstruction
170 misalignment
172 alignment openings
$V_{DD}$ voltage source

The invention claimed is:

1. An image sensor, comprising:

a first sensor layer having a first array of pixels; and a second sensor layer having a second array of pixels, wherein each of the pixels having an optical center, wherein the first sensor layer is stacked over the second sensor layer such that the optical centers of the first array of pixels are offset from the optical centers of the second array to form a predetermined pattern, wherein the first array of pixels has a first spatial pitch in a first direction and a second spatial pitch in a second direction, and wherein the first spatial pitch is larger than the second spatial pitch.

2. The image sensor of claim 1, wherein the second array of pixels has a first spatial pitch in the first direction and a second spatial pitch in the second direction, wherein the second spatial pitch is larger than the first spatial pitch.

3. The image sensor of claim 1, wherein each pixel includes a photodetector for collecting charge in response to incident light, a charge-to-voltage conversion mechanism, and a transfer gate for selectively transferring charge from the photodetector to the charge-to-voltage mechanism.

4. The image sensor of claim 1, further comprising an alignment structure for measuring the offset and rotational misalignment between the first sensor layer and second sensor layer.

5. The image sensor of claim 1, wherein each pixel includes a photodetector for collecting charge in response to incident light, and wherein a plurality of photodetectors are connected to a common charge-to-voltage mechanism.

6. The image sensor of claim 1, further comprising a color filter array situated over the first sensor layer.

7. The image sensor of claim 1, wherein the image sensor is a back illuminated sensor.

8. The image sensor of claim 1, further comprising a third sensor layer having a third array of pixels, wherein the optical centers of the third array of pixels are offset from the optical centers of the first and second arrays.

9. The image sensor of claim 8, further comprising a third sensor layer having a third array of pixels, the third array having a third spatial pitch in a third direction.

10. The image sensor of claim 1, wherein the first and second sensor layers each have first and second effective thicknesses, respectively, to collect light with first and second preselected ranges of wavelengths, respectively.

11. The image sensor of claim 1, wherein the first and second arrays of pixels are arranged such that the predetermined pattern is a square lattice.

12. The image sensor of claim 1, wherein the first and second arrays of pixels are arranged such that the predetermined pattern is a close-packed lattice.

13. A image sensing method, comprising:

providing a first sensor layer having a first array of pixels;

providing a second sensor layer having a second array of pixels;

wherein each of the pixels has an optical center, and wherein the first sensor layer is stacked over the second sensor layer such that the optical centers of the first array of pixels are offset from the optical centers of the second array to form a predetermined pattern;

capturing first and second images by the first and second sensor layers, respectively; and combining the first and second images into a final image, wherein the first array of pixels has a first spatial pitch in a first direction and a second spatial pitch in a second direction, and wherein the first spatial pitch is larger than the second spatial pitch.

14. The method of claim 13, wherein the second array has a first spatial pitch in the first direction and a second spatial pitch in the second direction, wherein the second spatial pitch is larger than the first spatial pitch.

15. The method of claim 13, further comprising providing an alignment structure for measuring the offset and rotational misalignment between the first sensor layer and second sensor layer.

16. The method of claim 13, further comprising providing a third sensor layer having a third array of pixels.

17. A method of producing an image sensor, comprising:

forming a first array of pixels on a first sensor layer;

forming a second array of pixels on a second sensor layer; and stacking the first sensor layer over the second sensor layer such that optical centers of the first array of pixels are offset from optical centers of the second array to form a predetermined pattern, wherein the first array of pixels has a first spatial pitch in a first direction and a second spatial pitch in a second direction, and wherein the first spatial pitch is larger than the second spatial pitch.

18. The method of claim 17, further comprising forming a color filter array over the first sensor layer.

19. The method of claim 17, further comprising:

forming a third sensor layer having a third array of pixels; and stacking the first, second and third sensor layers such that optical centers of the third array of pixels are offset from the optical centers of the first and second arrays.

20. The method of claim 17, wherein the second array of pixels has a first spatial pitch in the first direction and a second spatial pitch in the second direction, wherein the second spatial pitch is larger than the first spatial pitch.

21. The method of claim 17, further comprising:

forming an opening in the first sensor layer;

capturing an image by the second sensor layer created by light coming through the opening in the first sensor layer; and using the captured image to measure misalignment between the first sensor layer and the second sensor layer.

22. The method of claim 17, wherein the first and second arrays of pixels are arranged such that the predetermined pattern is a square lattice.

23. The method of claim 17, wherein the first and second arrays of pixels are arranged such that the predetermined pattern is a close-packed lattice.

* * * * *